United States Patent [19]

Legatti

[11] Patent Number: 4,731,576
[45] Date of Patent: Mar. 15, 1988

[54] ALTERNATING CURRENT WATT TRANSDUCER

[75] Inventor: Raymond H. Legatti, Clearwater, Fla.

[73] Assignee: Technology Research Corporation, Clearwater, Fla.

[21] Appl. No.: 797,619

[22] Filed: Nov. 13, 1985

[51] Int. Cl.[4] .......................................... G01R 21/06
[52] U.S. Cl. ................................... 324/142; 324/107
[58] Field of Search ............... 324/142, 107; 364/483, 364/841, 842, 843; 328/160

[56] References Cited

U.S. PATENT DOCUMENTS

| | | | |
|---|---|---|---|
| 3,875,509 | 4/1975 | Milkovic | 324/142 |
| 3,900,794 | 8/1975 | Bell | 324/142 |
| 3,955,138 | 5/1976 | Milkovic | 324/142 |
| 4,071,777 | 1/1978 | Herrmann | 328/160 |
| 4,182,983 | 1/1980 | Heinrich et al. | 324/142 |
| 4,451,784 | 5/1984 | Milkovic | 324/142 |

OTHER PUBLICATIONS

"Measuring Average Power in Nonlinear Devices", Electronics, 5/26/77, vol. 50, #11, pp. 116–118, by Collier.

Primary Examiner—Reinhard J. Eisenzopf
Assistant Examiner—W. Burns
Attorney, Agent, or Firm—Haight & Hofeldt

[57] ABSTRACT

An alternating current watt transducer including an integrated circuit analog multiplier, providing four quadrant multiplication, to the input terminals of which are applied alternating current signals proportional to the voltage and current determinative of the watts to be measured. The integrated circuit analog multiplier provides an alternating current output signal which being proportional to the product of the in-phase components of the input signals, is proportional to the watts being measured. The alternating current signal which is proportional to watts is transformed to a constant-current direct current output.

2 Claims, 2 Drawing Figures

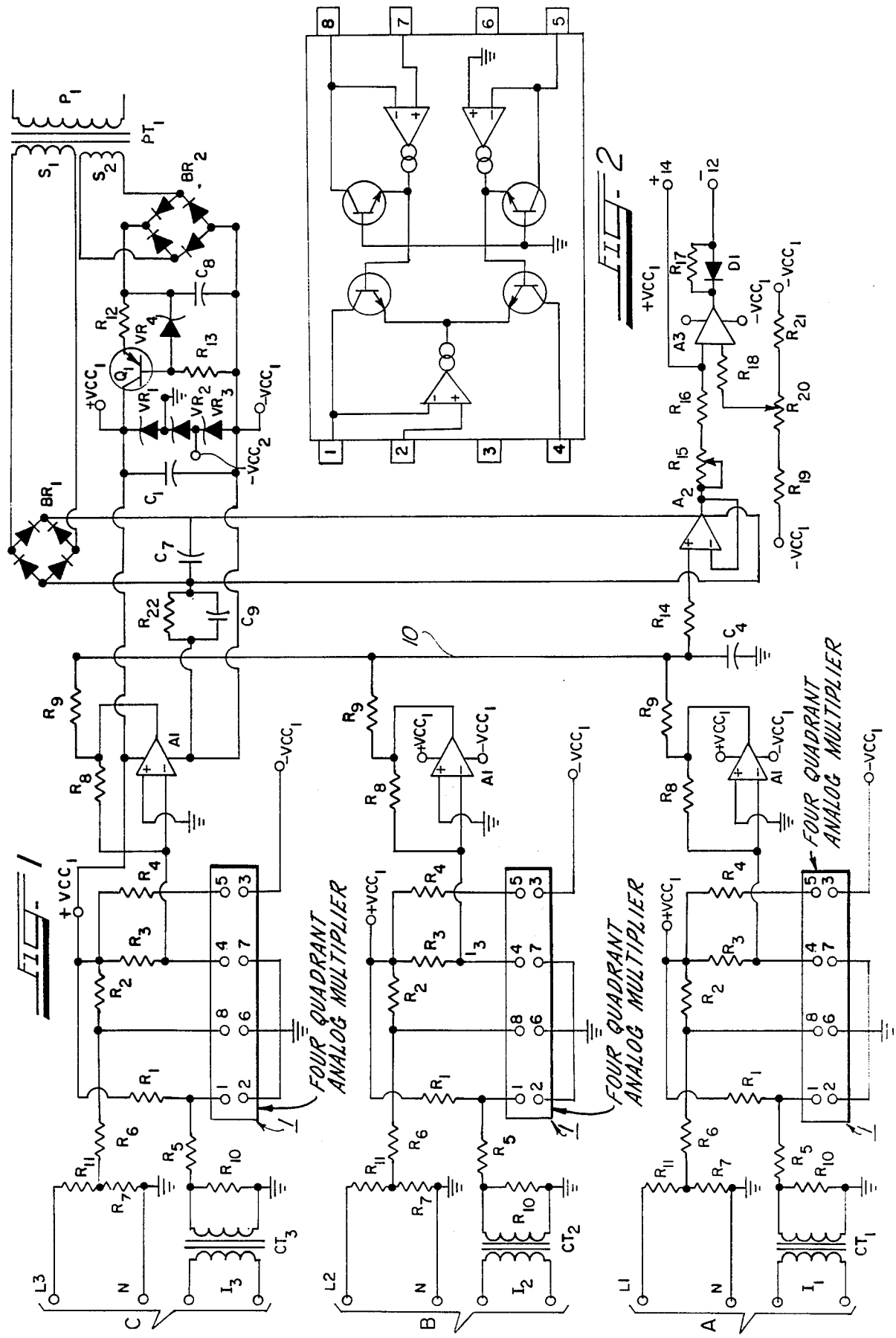

ALTERNATING CURRENT WATT TRANSDUCER

BACKGROUND OF THE INVENTION

Wattmeters of various types have been employed in the past to indicate the amount of power passing a particular location in a circuit by measuring the voltage at that location, and the current passing that location. When measuring power in alternating current circuits, it is necessary to take into consideration the relative phase relationship of the current and voltage, such that only the in-phase components are multiplied to determine the number of watts of power passing a particular location in a circuit.

Mechanical watt-hour meters have typically been employed in the past by power companies wishing to measure the amount of alternating current power that is used at a customer's location. With the advent of solid state electronic devices, watt and watt-hour meters utilizing such solid state devices have been disclosed. Many of these disclosed watt and watt-hour meters employing solid state devices utilize pulse circuit techniques. Such watt and watt-hour meters are disclosed in U.S. Pat. Nos. 3,500,200—Woodhead; 3,517,311—Wasielewski et al; 3,780,273—Turrell; and 3,953,795—Brunner et al. Still other patents showing solid state watt or watt-hour meters utilizing solid state devices employing pulse techniques are U.S. Pat. Nos. 3,976,942—Mayfield and 3,959,724—Chana et al.

U.S. Pat. No. 4,437,059—Hauptmann is similar to the previously mentioned patents in disclosing a solid state wattmeter utilizing pulse techniques. However, the disclosure of the Hauptmann patent is directed to features of the magnetic coupling to the conductors in which the current flow is to be measured, and to the use of photoelectric devices for coupling purposes.

It is an object of the present invention to provide a watt transducer for AC power measurement utilizing an integrated circuit analog multiplier providing four quadrant multiplication which receives two alternating current inputs, one proportional to the current and the other to the voltage associated with the alternating current power to be measured.

It is a further object of the present invention to provide an alternating current watt transducer wherein the in-phase components of AC signals which are proportional to the AC voltage and AC current associated with the power to be measured, are multiplied by each other, so as to provide an alternating current output signal proportional to the AC power to be measured.

It is a still further object of the present invention, when applied to multi-phase applications, to add signals representing the power in each of the phases to provide a signal representative of the total power being measured in the multi-phase circuit. Further, without regard to whether the watt transducer of this invention is utilized for single phase or multi-phase power measurements, a signal conversion circuit is provided to develop from an alternating current signal representative of the total power being measured, a constant-current DC output which is also indicative of the total power being measured.

SUMMARY OF THE INVENTION

The present invention provides an improved alternating current watt transducer utilizing an integrated circuit analog multiplier providing four quadrant multiplication, to provide an alternating current output signal which is proportional to the product of the in-phase components of the alternating current and voltage, the in-phase portions of which are a measure of the power to be measured. The alternating current output which is representative of the power being measured is converted to a DC signal by a solid state amplifier. In accordance with this invention, when multi-phase alternating current power is measured, the DC signals representing power in each phase are summed and supplied to a circuit, the output of which is a direct constant-current proportional to the total power being measured. Power measurements with accuracies of one-tenth of a percent are readily obtainable with the present invention.

BRIEF DESCRIPTION OF THE DRAWINGS

FIG. 1 is a schematic circuit diagram illustrating a three-phase embodiment of the alternating current watt transducer of the present invention;

FIG. 2 is a schematic circuit diagram of the integrated circuit analog multiplier utilized in the circuit shown in FIG. 1;

DETAILED DESCRIPTION OF THE PREFERRED EMBODIMENT

Referring to the drawings, a circuit diagram for a three-phase watt transducer in accordance with the preferred embodiment of this invention is shown. Since the watt transducers for each of the three phases are identical, like referenc numerals will be used to identify identical circuit components. The three-phases are indicated by the brackets labeled A, B, and C on the left of the Figure. The principle component of each of the watt transducers is an integrated circuit analog multiplier providing four quadrant multiplication, identified by the numeral 1. A functional diagram of an integrated circuit analog multiplier is shown in FIG. 2.

The circuit shown in FIG. 2 relates specifically to an analog multiplier identified as the RC4200, manufactured by the Raytheon Company. A general description and the functional operation of the Raytheon 4200 analog multiplier is set forth in a six page product specification published by Raytheon Company entitled, Linear Integrated Circuits—Analog Multiplier 4200, dated October, 1981. As utilized in the watt transducer of this invention, the desirable functional feature of this particular integrated circuit analog multiplier is that with alternating current voltage inputs applied to two of its input terminals, an alternating current output signal is provided at a third terminal which is the product of the two input voltages, taken into account any phase difference between the two input voltages. That is, in performing the multiplication of the two input alternating current voltages, out of phase components of the two voltages are automatically rejected, such that the multiplication is of only in-phase components. Thus, if a reactive load is present on any one of the phases, such that the current signal is displaced in time with respect to the voltage signal, the integrated circuit analog multiplier will take into account the phase angle, such that its output signal will be a true indication of watts.

FIG. 2 shows a functional diagram of the Raytheon 4200 multiplier set forth in the above-mentioned product specification. The AC signals applied to terminals 1 and 8 are, as previously set forth, multiplied to provide an output at terminal 4 which is proportional to the product of the in-phase portions of the signals applied to terminals 1 and 8. While the integrated circuit analog multiplier, as shown, is designed to provide an output at terminal 4 which is proportional to the product of the inputs at terminal 1 and 8, divided by the input at terminal 5, the divisor function is not used in the watt transducer of this invention.

Referring again to FIG. 1, the integrated circuit analog multipliers identified by the numeral 1 are shown with eight (8) terminals, all eight of which are labeled to correspond with the terminals of the integrated circuit analog multiplier functional diagram shown in FIG. 2. Since the watt transducers in each of the phases A, B, and C are to a large extent identical, the operation of the watt transducer for phase A will be described with it being understood that the description also generally applies to the watt transducers for phases B and C. A current transformer CT1 has a primary winding with the current I1 flowing therethrough being equal or proportional to the current flow in phase A. The output of the secondary winding of current transformer CT1 is applied to a resistor R10 to create a voltage output which is applied through resistor R5 to input terminal 1 of the analog multiplier 1. The voltage appearing in phase A between line L1 and the neutral N is applied across voltage dividing resistors R11 and R7, with the voltage at the junction thereof, being applied through resistor R6 to input terminal 8 of the analog multiplier. Apart from the input signals applied to terminals 1 and 8 of the analog multiplier, a bias voltage +VCC1 is applied to terminals 1, 4, 5, and 8 through resistors R1, R3, R4, and R2, respectively. Terminals 2, 6 and 7 of the analog multiplier 1 are grounded, while a reference voltage −VCC1 is applied to terminal 3. The output of the analog multiplier 1 developed at terminal 4, which is essentially the in-phase product of the voltages applied to terminals 1 and 8, is applied to the negative input terminal of an operational amplifier A1. The positive input of operational amplifier A1 is grounded. A portion of the output of the operational amplifier is fed back to the negative input terminal through a resistor R8. The operational amplifier A1 converts the alternating current output signal of analog multiplier 1 to a DC voltage output signal which is applied through a resistor R9 to a summing bus 10. Similarly, the outputs of the operational amplifier A1 in phase B and of operational amplifier A1 in phase C are also applied to the summing bus 10 through resistors R9.

A capacitor C4 connected between summing bus 10 and ground serves as an AC filter. The voltage appearing on summing bus 10 is applied through a resistor R14 to the positive input terminal of an operational amplifier A2. The output of operational amplifier A2 is fed back to the negative input, and is also provided through an adjustable resistor R15 and a resistor R16 to the negative input terminal of another operational amplifier A3. Adjustable resistor R15 is provided for the purpose of adjusting the gain, so as to provide a full range output. Thus, operational amplifier A2 serves as a voltage followerbuffer amplifier. The positive input of operational amplifier A3 is provided with an offset voltage through a resistor R18 by way of a potentiometer R20 which is connected in series with two resistors R19 and R21, between the negative VCC1 and negative VCC2 reference voltages. A constant-current proportional to the voltage signal present at the output terminal of operational amplifier A2 is developed between the terminals 12 and 14. This constant-current output may drive a DC ammeter or other suitable load. A zero current output between terminals 12 and 14 is equal to zero watts input as measured in phases A, B, and C.

Adjustment of the voltage applied to the positive input terminal of operational amplifier A3 through resistor R18 by way of potentiometer A20 provides a means for eliminating any offset errors occurring in any one of the phases with a zero current input.

Two power supplies energized from one of the phases A, B, or C provide the necessary operating power and bias voltages for each of the three watt transducers. A primary P1 of transformer PT1 is energized from one of the phase voltages, with the two power supplies being energized from secondary windings S1 and S2. Secondary winding S1 is connected to the input terminals of a full wave bridge rectifier BR1. The output of BR1 is filtered by capacitor C7 and provided to the power supply terminals of operational amplifier A2. The output of the second secondary winding S2 is provided to the input terminals of a full wave bridge rectifier BR2. The output of bridge rectifier BR2 is filtered by capacitor C8 and is provided through resistor R12 to the emitter of regulating transistor Q1. The base voltage of transistor Q1 is provided by a voltage appearing at the junction of a resistor R13 and a zener diode VR4 which are connected in series across the output of bridge rectifier BR2. Three zener diodes VR1, VR2, and VR3 are connected in series between the collector of transistor Q1 and the negative output terminal of bridge rectifier BR2 to provide several regulated output voltages. The regulated output is further filtered by capacitor C1, and is then applied to the power terminals of amplifier A1. With the junction between zener diodes VR1 and VR2 being grounded, the voltage references +VCC1, −VCC2 and −VCC1 are provided by the series connected zener diodes.

Finally, the two power supplies are coupled to each other through the parallel connected capacitor C9 and resistor R22. The reference voltages +VCC1, −VCC2 and −VCC1 are applied to the watt transducers at the terminals as indicated by the referenc voltages. If the circuit isolation provided by separate power supplies is not necessary, only one power supply need be used.

A preferred three phase embodiment of the present invention has been described herein. However, it is to be understood the changes and modifications thereto are within the intent and spirit of the present invention. For instance, it is obvious that when desired, the invention may readily be applied to single phase applications.

I claim:

1. A single phase AC watt transducer comprising:
an integrated circuit analog multiplier which provides four quadrant multiplication, said multiplier having at least two input terminals, to each of which is applied an AC input signal, said input AC signals having magnitudes which, with respect to each other have in-phase components, and at least one output terminal, upon the application of AC input signals to said at least two input terminals, an AC output signal being produced at said at least one output terminal, said AC output signal having a magnitude which is proportional to the product of the in phase components of the magnitudes of said at least two AC input signals, the magnitude of one of said AC input signals being proportional to an AC current, and the magnitude of the other of said AC input signals being proportional to an AC voltage across a load through which said AC current is flowing, such that the magnitude of said AC output signal is proportional to and a measurement of the power transfer to the load represented by the AC current and the AC voltage with respect to which said AC input signals are proportional, a first operational amplifier having at least one input terminal and at least one output terminal, said AC output signal being applied to said input termianl of said first operational amplifier, a DC output signal being produced at said output terminal of said first operational amplifier which is proportional to and a measurement of power transfer determined by the AC current and the AC voltage, a second operational amplifier having at least one input terminal and at least one output terminal, a resistor connected in series with said at least one input terminal of said second operational amplifier, the DC output signal of said first operational amplifier being applied to said at least one input terminal of said second operational amplifier through said resistor, a constant-current being produced at said at least one output terminal of said second operational amplifier which is proportional to and a measurement of power transfer determined by the AC current and the AC voltage.

2. A multiphase AC watt transducer for measuring power in a system having multiphases comprising:

at least one integrated circuit analog multiplier which provides four quadrant multiplication for each phase of said multiphases, said multipliers each having at least two input terminals to each of which is applied an AC input signal, said AC input signals having magnitudes which, with respect to each other have in-phase components, and at least one output terminal, upon the application of AC input signals to said at least two input terminals, an AC output signal being produced at said at least one output terminal, said AC output signal having a magnitude which is proportional to the product of the in phase components of the magnitude of one of said AC input signals being proportional to an AC current, and the magnitude of the other of said AC input signals being proportional to an AC voltage across a load through which said AC current is flowing, such that the magnitude of said AC output signal is proportional to and a measurement of the power transfer to the load by one phase of a multiphase power system as represented by the AC current and the AC voltage with respect to which said input signals are proportional, at least one first operational amplifier for each phase of said multiphases, each of said first operational amplifiers having at least one input terminal and at least one output terminal, said AC output signal of each one of said integrated circuit analog multipliers being applied to said input terminal of one of said first operational amplifiers, a DC output signal being produced at said output terminal of each of said first operational amplifiers which is proportional to and a measurement of power transfer to the load by one phase of said multiphases, as represented by the AC current and the AC voltage to which said input signals are proportional, a summing bus, said DC output signals of each of said first operational amplifiers being applied to said summing bus, such that the sum of said DC output signals on said summing bus is proportional to and a measurement of power transfer in the multiphase circuit, a second operational amplifier having at least one input terminal and at least one output terminal, a resistor connected in series with said at least one input terminal of said second operational amplifier, the sum of said DC output signals on said summing bus being applied to said at least one input terminal of said second operational amplifier through said resistor, a constant-current being produced at said at least one output terminal of said second operational amplifier which is proportioal to and a measurement of power transfer in the multiphase circuit.

* * * * *

UNITED STATES PATENT AND TRADEMARK OFFICE
CERTIFICATE OF CORRECTION

PATENT NO. : 4,731,576
DATED : March 15, 1988
INVENTOR(S) : Raymond H. Legatti

It is certified that error appears in the above-identified patent and that said Letters Patent are hereby corrected as shown below:

Column 2, line 30, "referenc" should be -- reference --.

Column 2, line 52, "taken" should be -- taking --.

Column 5, line 39, "magnitude" should be -- magnitudes --; and before "one" should be inserted -- said at least two AC input signals, the magnitude of --.

Column 6, line 37, "proportioal" should be -- proportional --.

Signed and Sealed this

Nineteenth Day of July, 1988

Attest:

DONALD J. QUIGG

*Attesting Officer*     *Commissioner of Patents and Trademarks*